United States Patent
Dreifus et al.

(10) Patent No.: US 8,745,449 B2
(45) Date of Patent: *Jun. 3, 2014

(54) SYSTEMS AND METHODS FOR MANAGING END OF LIFE IN A SOLID STATE DRIVE

(75) Inventors: David L. Dreifus, Clinton, NJ (US); Robert W. Warren, Loveland, CO (US); Brian McKean, Longmont, CO (US)

(73) Assignee: LSI Corporation, San Jose, CA (US)

(*) Notice: Subject to any disclaimer, the term of this patent is extended or adjusted under 35 U.S.C. 154(b) by 120 days.

This patent is subject to a terminal disclaimer.

(21) Appl. No.: 13/347,827

(22) Filed: Jan. 11, 2012

(65) Prior Publication Data
US 2012/0110376 A1    May 3, 2012

Related U.S. Application Data

(62) Division of application No. 12/473,454, filed on May 28, 2009, now Pat. No. 8,176,367.

(51) Int. Cl.
*G06F 11/00* (2006.01)

(52) U.S. Cl.
USPC ............ 714/47.3; 714/6.13; 714/54; 714/47.2

(58) Field of Classification Search
USPC .................................. 714/47.1, 47.2, 47.3, 54
See application file for complete search history.

(56) References Cited

U.S. PATENT DOCUMENTS

| | | |
|---|---|---|
| 5,892,896 A | 4/1999 | Shingo |
| 6,516,425 B1 | 2/2003 | Belhadj et al. |
| 6,651,032 B2 | 11/2003 | Peterson et al. |
| 7,127,549 B2 | 10/2006 | Sinclair |
| 7,254,692 B1 | 8/2007 | Teoh et al. |
| 7,310,699 B2 | 12/2007 | Sinclair |
| 7,523,013 B2 | 4/2009 | Gorobets et al. |
| 7,596,656 B2 | 9/2009 | Elhamias |
| 7,721,146 B2 | 5/2010 | Polisetti et al. |
| 8,010,738 B1 | 8/2011 | Chilton et al. |
| 2002/0091965 A1 | 7/2002 | Moshayedi |
| 2005/0044459 A1 | 2/2005 | Scheuerlein et al. |
| 2005/0172067 A1 | 8/2005 | Sinclair |
| 2005/0204187 A1 | 9/2005 | Lee et al. |
| 2005/0209804 A1 | 9/2005 | Basso et al. |
| 2006/0245248 A1 | 11/2006 | Hu |
| 2007/0028040 A1 | 2/2007 | Sinclair |
| 2007/0263444 A1 | 11/2007 | Gorobets et al. |

(Continued)

FOREIGN PATENT DOCUMENTS

KR    10/2009/0013394    2/2009

OTHER PUBLICATIONS

U.S. Appl. No. 12/473,437, filed May 28, 2009, McKean.
U.S. Appl. No. 12/473,454, filed May 28, 2009, Dreifus et al.

(Continued)

*Primary Examiner* — Bryce Bonzo
*Assistant Examiner* — Elmira Mehrmanesh
(74) *Attorney, Agent, or Firm* — Hamilton DeSanctis & Cha

(57) ABSTRACT

Various embodiments of the present invention provide systems and methods for managing solid state drives. As an example, a storage system is described that include at least a first flash memory block and a second flash memory block, and a control circuit. The first flash memory block and the second flash memory block are addressable in the storage system. The control circuit is operable to identify the first flash memory block as partially failed, receive a write request directed to the first flash memory block; and direct the write request to the second flash memory block.

23 Claims, 6 Drawing Sheets

(56) References Cited

U.S. PATENT DOCUMENTS

| | | |
|---|---|---|
| 2007/0266200 A1 | 11/2007 | Gorobets et al. |
| 2008/0010557 A1 | 1/2008 | Kume |
| 2008/0046779 A1 | 2/2008 | Merchant et al. |
| 2008/0086275 A1 | 4/2008 | Astigarraga et al. |
| 2008/0162079 A1 | 7/2008 | Astigarraga et al. |
| 2008/0307270 A1 | 12/2008 | Li |
| 2009/0063895 A1 | 3/2009 | Smith |
| 2009/0067303 A1 | 3/2009 | Poo |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2010/0121609 A1 | 5/2010 | Gorinevsky |
| 2010/0122148 A1 | 5/2010 | Flynn et al. |
| 2010/0306577 A1 | 12/2010 | Dreifus et al. |
| 2010/0306580 A1 | 12/2010 | McKean et al. |

OTHER PUBLICATIONS

U.S. Appl. No. 12/691,797, filed Jan. 22, 2010, Warren et al.
U.S. Appl. No. 12/691,819, filed Jan. 22, 2010, Warren et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren et al.
U.S. Appl. No. 12/774,065, filed May 5, 2010, Warren, Robert.
U.S. Appl. No. 12/774,077, May 5, 2010, Warren, Robert.
U.S. Appl. No. 13/126,746, filed Apr. 28, 2011, Burger, Harley.

SYSTEMS AND METHODS FOR MANAGING END OF LIFE IN A SOLID STATE DRIVE

CROSS REFERENCE TO RELATED APPLICATIONS

The present application is a divisional application of (claims priority to) U.S. patent application Ser. No. 12/473,454 entitled "Systems and Methods for Managing End of Life in a Solid State Drive" and filed May 28, 2009 now U.S. Pat. No. 8,176,367 by Dreifus et al. The aforementioned applications is are assigned to an entity common hereto, and is incorporated herein by reference for all purposes.

BACKGROUND OF THE INVENTION

The present inventions are related to systems and methods for data storage, and more particularly to systems and methods for end of life management of a solid state drive and/or flash memory device.

Various approaches for data backup have been developed that vary from simple periodic copying of one storage device to another to more complex backup schemes such as RAID. Such approaches typically rely on redundancy to protect from data loss. In such systems, one or more copies of data are distributed across various storage devices. When a failure of one of the storage devices occurs, a replacement storage device is installed in place of the failed storage device, and the data corresponding to the failed storage device is gathered from redundant sources and written to the replacement storage device. Such approaches offer reasonable data security, but generally require a considerable amount of processing to be performed upon installation of the replacement storage device to replicate the failed storage device. As storage devices may fail at any time, substantial processing may be diverted to rebuilding the failed storage device at a time when such processing causes a noticeable, negative impact on other processes ongoing in a computing environment.

Hence, for at least the aforementioned reasons, there exists a need in the art for advanced systems and methods for managing the end of life of a failed storage device.

BRIEF SUMMARY OF THE INVENTION

The present inventions are related to systems and methods for data storage, and more particularly to systems and methods for end of life management of a solid state drive and/or flash memory device.

Various embodiments of the present invention provide storage systems that include at least a first flash memory block, a second flash memory block, and a control circuit. The first flash memory block and the second flash memory block are each addressable in the storage system. The control circuit is operable to identify the first flash memory block as partially failed, receive a write request directed to the first flash memory block; and direct the write request to the second flash memory block. In some instances of the aforementioned embodiments, the control circuit is further operable to: receive a read request directed to the first flash memory block; and direct the read request to the first flash memory where the read request is received prior to directing the write request to the second flash memory.

In some instances of the aforementioned embodiments, the first flash memory block is included in a first solid state drive, the second flash memory block is included in a second solid state drive, and the control circuit is included in a system controller that is communicably coupled to the first solid state drive and the second solid state drive. In some cases, the control circuit receives a write prohibit signal from the first solid state drive. In such cases, identifying the first flash memory block as partially failed is based at least in part on the write prohibit signal, and includes identifying the first solid state drive as partially failed. In particular cases, the control circuit is a first control circuit, the first solid state drive includes a second control circuit, and the second control circuit includes: an unreliable block identification circuit and a partial failure indication circuit. The unreliable block identification circuit is operable to determine that the first flash memory block is unreliable. The partial failure indication circuit is operable to assert the write prohibit signal upon determination that an insufficient number of memory blocks in the first solid state drive remain reliable.

In various instances of the aforementioned embodiments, the first flash memory block is included in a first solid state drive, the second flash memory block is included in a second solid state drive, and the control circuit is included in a system controller that is communicably coupled to the first solid state drive and the second solid state drive. The control circuit is operable to identify an estimated end of life of the first solid state drive. The control circuit receives a write prohibit signal from the first solid state drive, and identifying the first flash memory block as partially failed is based at least in part on the write prohibit signal. The control circuit is operable to assure that all data from the first solid state drive is transferred to the second solid state drive before the estimated end of life. In some instances of the aforementioned embodiments, the control circuit is a first control circuit, the first solid state drive includes a second control circuit, and the second control circuit includes: an unreliable block identification circuit that is operable to determine that the first flash memory block is unreliable; a partial failure indication circuit that is operable to assert the write prohibit signal upon determination that an insufficient number of memory blocks in the first solid state drive remain reliable; a time stamp circuit that is operable to identify a first point in time when the partial failure indication circuit asserted the write prohibit signal; and an end of life indication circuit that is operable to estimate a second point in time based at least in part on the first point in time. The second point in time is the estimated end of life of the first solid state drive.

In other instances of the present invention, the control circuit is implemented in a system control unit. The system control unit includes a plurality of interfaces. A first replaceable memory device includes the first flash memory block and is installed in a first of the plurality of interfaces, and a second replaceable memory device includes the second flash memory block and is installed in a second of the plurality of interfaces. The interfaces may be, for example, USB interfaces, and/or DIMM interfaces. In yet other instances of the aforementioned embodiments, the first memory block, the second flash memory block, and the control circuit are implemented in a single flash memory device.

Other embodiments of the present invention provide methods for managing the end of life of a flash memory device. The methods include providing a first flash memory block and a second flash memory block, determining that the first flash memory block is becoming unreliable, identifying the first flash memory block as read only based at least in part on the determination of unreliability, and mapping the second flash memory block to the first flash memory block. In some instances, the methods further include receiving a write request directed to the first flash memory block; and directing the write request to the second flash memory block. Other instances of the methods include receiving a read request directed to the first flash memory block; and satisfying the read request to the first flash memory block.

In various instances of the aforementioned embodiments, the first flash memory block is included in a first solid state drive, the second flash memory block is included in a second solid state drive, and the control circuit is included in a system controller that is communicably coupled to the first solid state drive and the second solid state drive. In some such instances, the methods further include estimating an end of life of the first solid state drive; and transferring all data from the first solid state drive to the second solid state drive before the estimated end of life of the first solid state drive. Estimating the end of life of the first solid state drive may include determining a point in time corresponding to the determination of unreliability, and adding a fixed time increment to the point in time to yield the estimated end of life. In yet other instances of the aforementioned embodiments, the methods further include: providing a third flash memory block that includes write-once, read many data; and transferring the write-once, read many data to the first memory block.

In one or more instances of the aforementioned embodiments, the control circuit is implemented in a system control unit that includes a plurality of interfaces. A first replaceable memory device includes the first flash memory block and is installed in a first of the plurality of interfaces, and a second replaceable memory device includes the second flash memory block and is installed in a second of the plurality of interfaces. The methods may further include removing the first replaceable memory device after data from the first replaceable memory device has been moved to the second replaceable memory device; and installing a third replaceable memory device in the first of the plurality of interfaces.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data storage, and more particularly to systems and methods for end of life management of a solid state drive and/or flash memory device.

Figure 1:
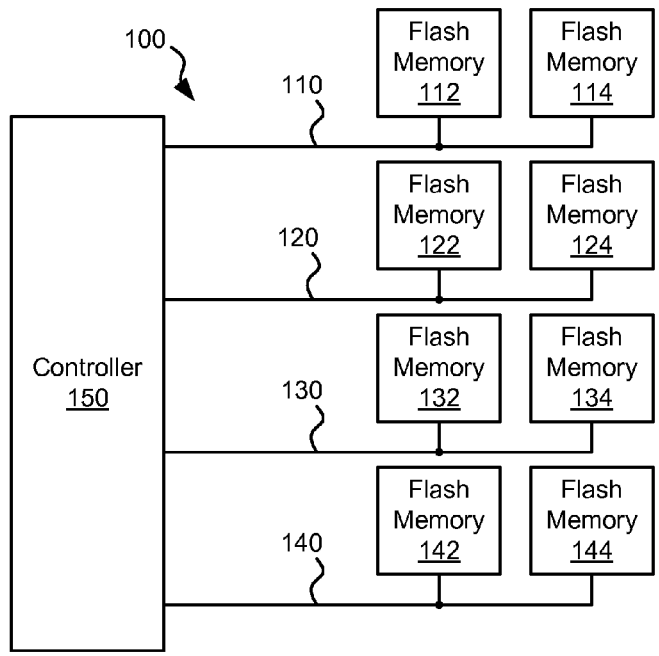
FIG. 1 depicts an exemplary, prior art solid state drive.

Flash memory devices have been used in a variety of systems where stored information must be maintained even when power to the system is lost. Such flash memory devices can be grouped together with a system controller to implement what are commonly referred to as solid state drives. FIG. 1 depicts an exemplary, prior art solid state drive 100 that includes a number of flash memory devices 112, 114, 122, 124, 132, 134, 142, 144 each coupled to a controller 150 via lanes 110, 120, 130, 140. Each of lanes 110, 120, 130, 140 includes a combination of control signals and data signals that allow for accessing the respective flash memory devices.

Each of flash memory devices 112, 114, 122, 124, 132, 134, 142, 144 include a number of readable and writable memory cells that are arranged in storage blocks. The memory cells may be charged to two or more distinct voltage levels that represent one or more data bits. Each time a memory cell is written, the performance of the cell degrades. This degradation progresses until the cell is no longer reliably written. Because of this, flash memory devices are typically rated based upon the number of program/erase cycles expected from the device. As an example, a single level cell capable of storing a single bit of data may be expected to withstand 100K program/erase cycles before becoming unreliable. In contrast, a multi-level cell capable of storing two bits of data may be expected to withstand 10K program/erase cycles before becoming unreliable.

Figure 2:
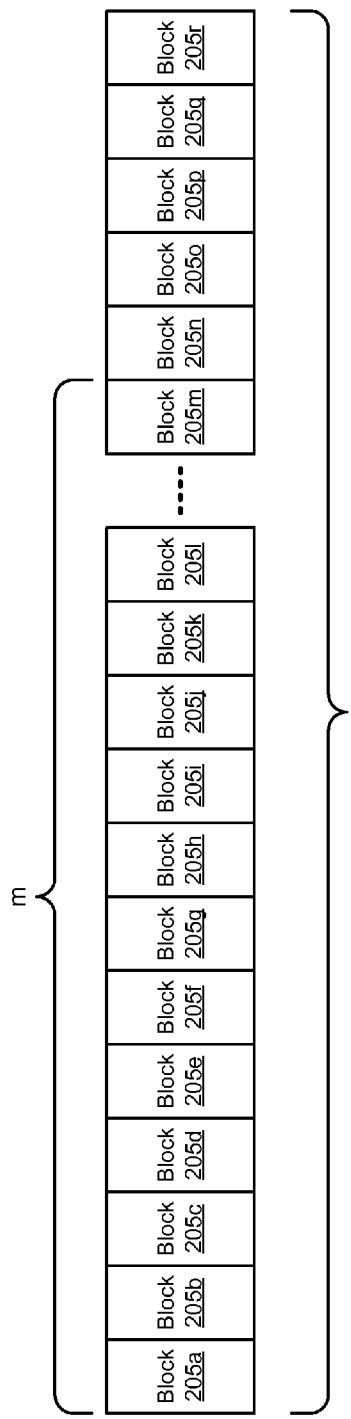
FIG. 2 graphically depicts over provisioning in a solid state drive.

In an effort to extend the life cycle of a flash memory device, various approaches for wear leveling have been developed that seek to assure that storage blocks in a flash memory device degrade at approximately the same rate. These approaches generally require moving data around in the device to level the number of writes across the blocks in the device. As part of this wear leveling, flash memory devices may be over provisioned with one or more storage blocks in excess of the storage blocks that appear accessible from the user interface. A graphical depiction of this over provisioning is provided in FIG. 2. As shown, the memory space of a flash memory device 200 is implemented as a number of blocks 205, with each block having a number of memory cells. The addressable memory space of flash memory device 200 is represented by 'm', and the actual number of blocks is represented by 'n'. The difference between m and n (i.e., n−m) is the over provisioning of blocks in memory device 200. In operation, where one block becomes unreliable, data from that block is moved to a reliable block and the block from which the data was moved is marked as unusable. When this occurs the value of n is decreased to recognize the newly identified unreliable data block. Eventually, as more and more blocks are rendered unreliable, n becomes equal to m. From this point, when another block is rendered unreliable, flash memory device 200 no longer offers its full usable memory space and is identified as unusable. Flash memory device 200 and/or the solid state drive in which it is deployed may then be replaced. Such failure can be unpredictable, and in one or more cases unrecoverable.

Various embodiments of the present inventions provide systems and methods for modifying the state of a flash memory device from a read/write device to a read only device when the number of remaining reliable blocks within a device drops below a threshold level. Such an insufficient number of reliable blocks remaining condition may be referred to herein as a "partial failure", and a solid state drive exhibiting this condition may be referred to as a "partially failed" device. In some cases, the threshold level may be programmable. As a partially failed device (i.e., a read only device), the data stored on the device may be accessed for a finite period of time, and during that finite period of time, the data may be moved to a replacement device. Some of the aforementioned embodiments are enhanced by identifying a point in time when the state of the flash memory device is converted to a read only device. A time period measured from the point at which the state of the device was changed may be estimated and used to guide scheduling of the movement of data from the failing device to the replacement device. Other embodiments of the present inventions provide systems and methods for transitioning data from a partially failed device to a replacement device.

Figure 3:
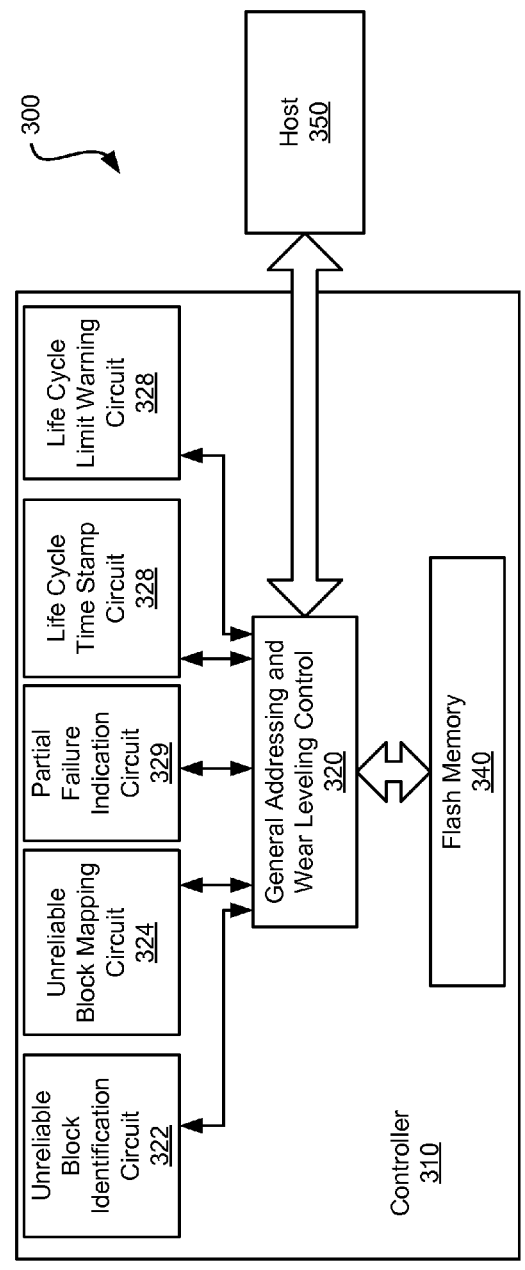
FIG. 3 depicts a solid state drive including write prohibition and life cycle determination circuitry in accordance with one or more embodiments of the present invention.

Turning to FIG. 3, a block diagram of a processing system 300 including a solid state drive 310 with write prohibition (i.e., read only state) and life cycle determination circuitry is shown in accordance with one or more embodiments of the present invention. Solid state drive 310 includes a block of flash memory 340 that is accessible under the direction of a control circuit 320. Information may be provided to flash memory 340 via control circuit 320 from a host 350, and information from flash memory 340 may be provided to host 350 via control circuit 320. Host 350 may be, but is not limited to, a central processing unit or an interface circuit as are known in the art. Based upon the disclosure provided herein, one of ordinary skill in the art will recognize a variety of host devices that may be used in relation to different embodiments of the present invention.

Control circuit 320 includes general addressing control and wear leveling control similar to that provided by system controllers in existing solid state drives. In addition to this, control circuit 320 includes an unreliable block identification circuit 322, an unreliable block mapping circuit 324, a time stamp circuit 326, and an end of life indication circuit 328, and a partial failure indication circuit 329. Unreliable identification circuit 322 is operable to identify blocks that have become unreliable. As an example, unreliable block identification circuit 322 may include a timer that determines how long it takes to perform a program/erase cycle to the block. An increase in the length of time required to perform a program erase cycle may be used as a proxy for block reliability. Thus, a block may be identified as unreliable where the program/erase cycle time exceeds a threshold level. In some cases, the threshold level may be user programmable. As another example, unreliable block identification circuit 322 may include circuitry capable of monitoring the number of errors associated with a given block. Where the error rate exceeds an error correction capability of controller 320 to correct, the block may be identified as unreliable. Based upon the disclosure provided herein, one of ordinary skill in the art will recognize a variety of circuits and/or approaches to identify when a block has become unreliable.

Identification of an unreliable block is provided to unreliable block mapping circuit 324. Unreliable block mapping circuit 324 marks the block as unreliable, and causes data in the block to be moved to a reliable block. By marking the block as unreliable, unreliable block mapping circuit 324 removes the block from consideration for receiving future write data. In addition, unreliable block mapping circuit 324 causes any wear leveling circuitry included in control circuit 320 to exclude the newly identified unreliable block from the operating wear leveling algorithm. This effectively reduces the value of 'n' as described above in relation to FIG. 2. A threshold level for determining whether the device is unreliable may take into account whether the block is comprised of multi-level cells or single-level cells.

Partial failure indication circuit 329 monitors the number of unreliable memory blocks and/or the number of remaining reliable memory blocks. In one implementation, partial failure indication circuit 329 includes a number of counters that are incremented and/or decremented whenever memory blocks are identified as unreliable. Using either or both of the number of unreliable memory blocks and/or the number of remaining reliable memory blocks, partial failure indication circuit 329 determines whether there is a sufficient number of remaining reliable blocks to assure read/write operation. Where an insufficient number remain, solid state drive 310 is write prohibited and partial failure indication circuit 329 identifies solid state drive as partially failed. Said another way, it is determined whether the remaining value of 'n' is sufficiently large to guarantee reasonable operation for a defined time into the future. In some cases, this includes comparing the number of remaining reliable blocks (i.e., n) against a threshold value. This threshold value may be hard coded or user programmable depending upon the particular implementation. In particular embodiments of the present invention, the threshold value is set such that it is equal to the number of addressable blocks (i.e., m) in flash memory 340. In other cases, the threshold value is set as some value greater than the number of blocks addressable in flash memory 340.

Where partial failure indication circuit 329 determines that there are not a sufficient number of remaining reliable blocks (i.e., a partial failure of solid state drive 310 has occurred), time stamp circuit 326 indicates a time when the insufficiency is identified. This may be done, for example, by accessing a system timer output available from host 350 and storing the timestamp information in end of life indication circuit 328. Alternatively, time stamp circuit 326 may include a timer circuit from which the time stamp is derived and stored in end of life indication circuit 328. Based upon the disclosure provided herein, one of ordinary skill in the art will recognize other approaches for time stamping the change of state event.

Based upon the time stamp, end of life indication circuit 328 determines an estimated failure time of solid state drive 310. This may be done by adding a fixed time increment to the time stamp. The fixed time increment may be a conservative estimate of how long data will be expected to be accessible from the partially failed solid state drive 310. The estimate may be modeled based upon an expected number of reads to a given block of memory and a statistically modeled life cycle of memory cells within the device from the point where the cells become unreliable. In other cases, the time increment may be variable, taking into account the actual number of reads from the most accessed memory cell in solid state drive 310. This read count may be combined with a statistically modeled life cycle of memory cells within the device from the point where the cells become unreliable to derive a life cycle that varies depending upon the number of reads. In turn, end of life indication circuit 328 provides an indication to host 350 of the estimated failure time. The aforementioned approach provides for an indication of estimated failure time without a great deal of interaction with host 350. As an advantage of such an approach, the estimated time of failure is always associated with and available from solid state drive 310. Thus, if solid state drive 310 is disassociated from host 350 and communicably coupled to another host, the estimated time of failure is still available.

By providing an estimated failure time, host 350 or another host communicably coupled to solid state drive 310 may be begin preparing to replace solid state drive 310 within the estimated time period. Various approaches for replacement may be used in relation to different embodiments of the present invention. Various such approaches for transferring data from a partially failed solid state drive to a replacement drive are more fully discussed below.

It should be noted that a variety of other approaches for time stamping and determining expiration date of solid state drive may be implemented in accordance with different embodiments of the present invention. For example, solid state drive 310 may provide an indication to host 350 that solid state drive has partially failed. In turn, host 350 may time stamp the occurrence, and determine an estimated failure time. In such an embodiment, the functions of end of life indication circuit 328 and time stamp circuit 326 are implemented in host 350. Such an approach would be most effective where solid state drive 310 is expected to remain in communicable contact with host 350. Such an approach advantageously limits the amount of circuitry that must be implemented in solid state drive 310, but in some cases may require that solid state drive 310 remain associated with host 350. Further, such an approach requires that host 350 either know of the fixed time increment specific to solid state drive 310, or use a fixed time increment that is generic to a number of different solid state drives.

In particular implementations, end of life indication circuit 328 may include a battery backed clock. Based upon the output of the battery backed clock, end of life indication circuit 328 may report expected remaining life of solid state drive 310 at defined time intervals. Alternatively, or in addition, end of life indication circuit 328 may report expected remaining life of solid state drive 310 based upon the output of the battery backed clock whenever queried by host 350 or another host.

As another example, solid state drive 310 may provide an indication to host 350 that an insufficient number of remaining reliable blocks are available. In turn, host 350 may read a fixed increment of remaining life cycle from solid state drive 310 and add it to a time stamp obtained within host 350 to yield an estimated failure time of solid state drive 310. At this point, the estimated failure time is stored back to solid state drive 310. Such an approach provides for an indication of estimated failure time with a small amount of interaction with host 350 and a reduction in circuitry that must be implemented in solid state drive 310. As an advantage of such an approach, the estimated time of failure is always associated with solid state drive 310. Thus, if solid state drive 310 is disassociated from host 350 and communicably coupled to another host, the estimated time of failure is still available. Further the fixed time increment is specific to solid state drive 310.

As yet another example, solid state drive 310 may included a timer circuit that provides a power on time since the determination that an insufficient number of remaining reliable blocks are available. This power on time may be reported to host 350 and used to determine an appropriate time frame for moving any data maintained on solid state drive 310 to an alternative storage location.

Figure 4:
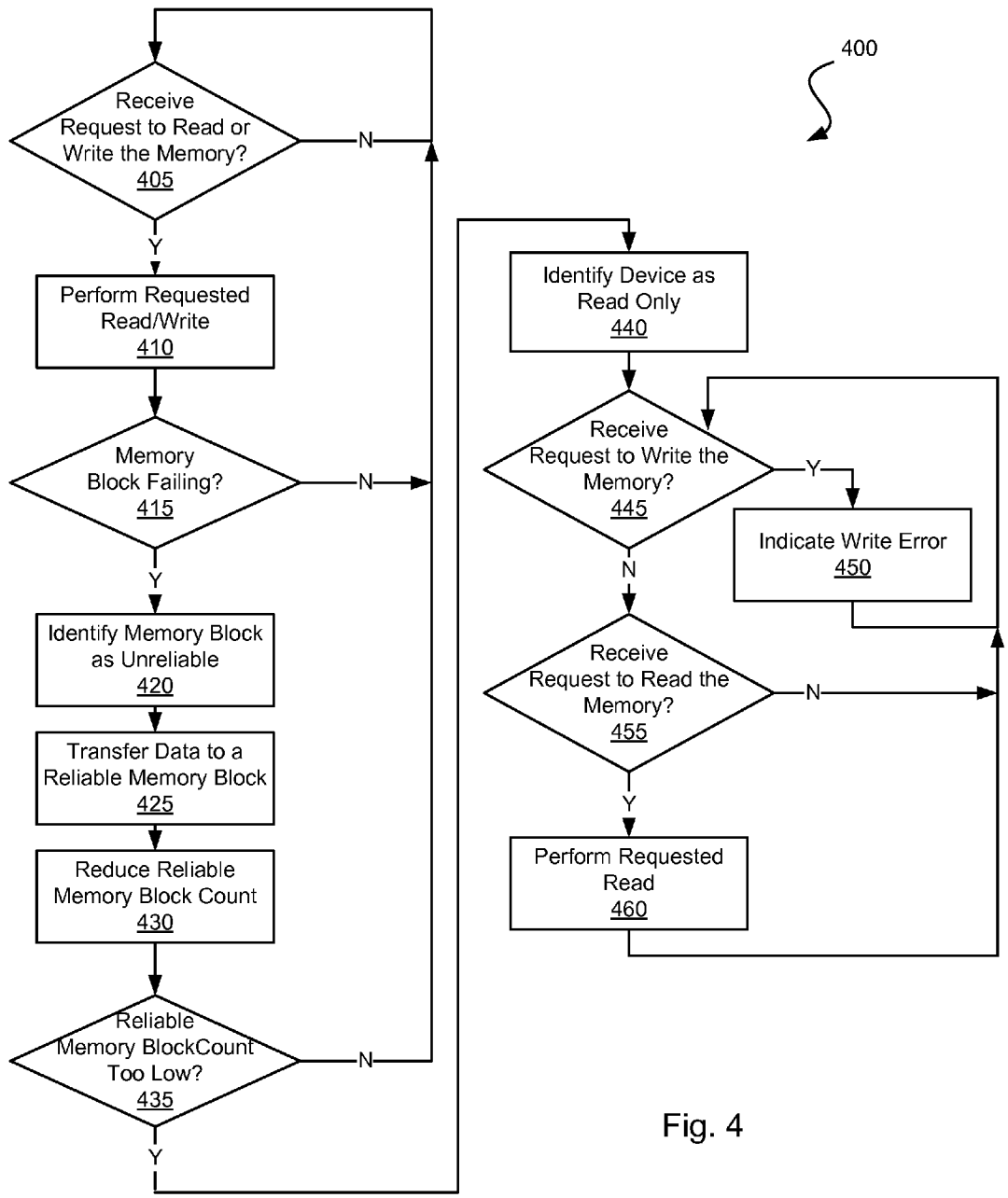
FIG. 4 is a flow diagram showing a method in accordance with some embodiments of the present invention for identifying a solid state drive as write prohibited.

Turning to FIG. 4, a flow diagram 400 graphically depicts a method in accordance with some embodiments of the present invention for identifying a solid state drive as write prohibited (i.e., partially failed). Following flow diagram 400, is it determined whether the solid state drive has been presented with a request to read or write information to/from the solid state drive (block 405). Where a request for a read or a write is received (block 405), the requested read or write is performed (block 410). Thus, for example, where the request is a write request, information may be provided from the host to the controller which writes the data to a defined location in the flash memory. As another example, where the request is a read request, data from the requested location in the flash memory is transferred to the controller and then to the requesting host.

The reliability of the memory region (i.e., memory block) to which the data is written or from which it is read is determined (block 415). In some embodiments, this determination is only made after a write cycle. In other cases the determination is made after either a write cycle or a read cycle is done. Any approach known in the art for determining reliability of a memory block may be used. As an example, determination of block reliability may include determining the amount of time required to perform a program/erase cycle to the block. An increase in the length of time required to perform a program erase cycle may be used as a proxy for block reliability. Thus, a block may be identified as unreliable where the program/erase cycle time exceeds a threshold level. As another example, determination of block reliability may include monitoring the number of errors associated with accessing a given block. Where the error rate exceeds a threshold level, the block may be identified as unreliable. Based upon the disclosure provided herein, one of ordinary skill in the art will recognize a variety of circuits and/or approaches to identify when a block has become unreliable.

Where the block is determined to be reliable (block 415), a subsequent read or write request is awaited (block 405). Alternatively, where the block is determined to be unreliable (block 415), the memory block is identified as unreliable (block 420), and data from the unreliable memory block is moved to a reliable memory block (block 425). The number of reliable memory blocks is then decreased to reflect the recently identified unreliable block (block 430). This effectively reduces the value of 'n' as described above in relation to FIG. 2. It is then determined whether the number of remaining reliable memory blocks has become too low to continue guaranteeing reasonable operation (block 435). In some cases, this includes comparing the number of remaining reliable blocks (i.e., n) against a threshold value. This threshold value may be hard coded or user programmable depending upon the particular implementation. In particular embodiments of the present invention, the threshold value is set such that it is equal to the number of addressable blocks (i.e., m) in the flash memory. In other cases, the threshold value is set as some value greater than the number of blocks addressable in the flash memory.

Where the count of reliable blocks is sufficiently high (block 435), a subsequent read or write request is awaited (block 405). Alternatively, where the count of reliable blocks is too low (block 435), the solid state drive is identified as a read only device (block 440). Said another way, the solid state device is identified as partially failed, and future writes to the solid state drive are prohibited. The write prohibited mode is set forth in blocks 445-460 below. It is determined whether the solid state drive has been presented with a request to read or write information to/from the solid state drive. In particular, it is determined whether a request to write information to the solid state drive has been received (block 445). Where a request to write has been received (block 445), an error message is provided to the requesting host indicating that the write was not accepted (block 450). Alternatively, it is determined whether a read request has been received (block 455). Where a read request has been received (block 455), the requested read is performed and the data is returned to the requesting host (block 460).

Figure 5:
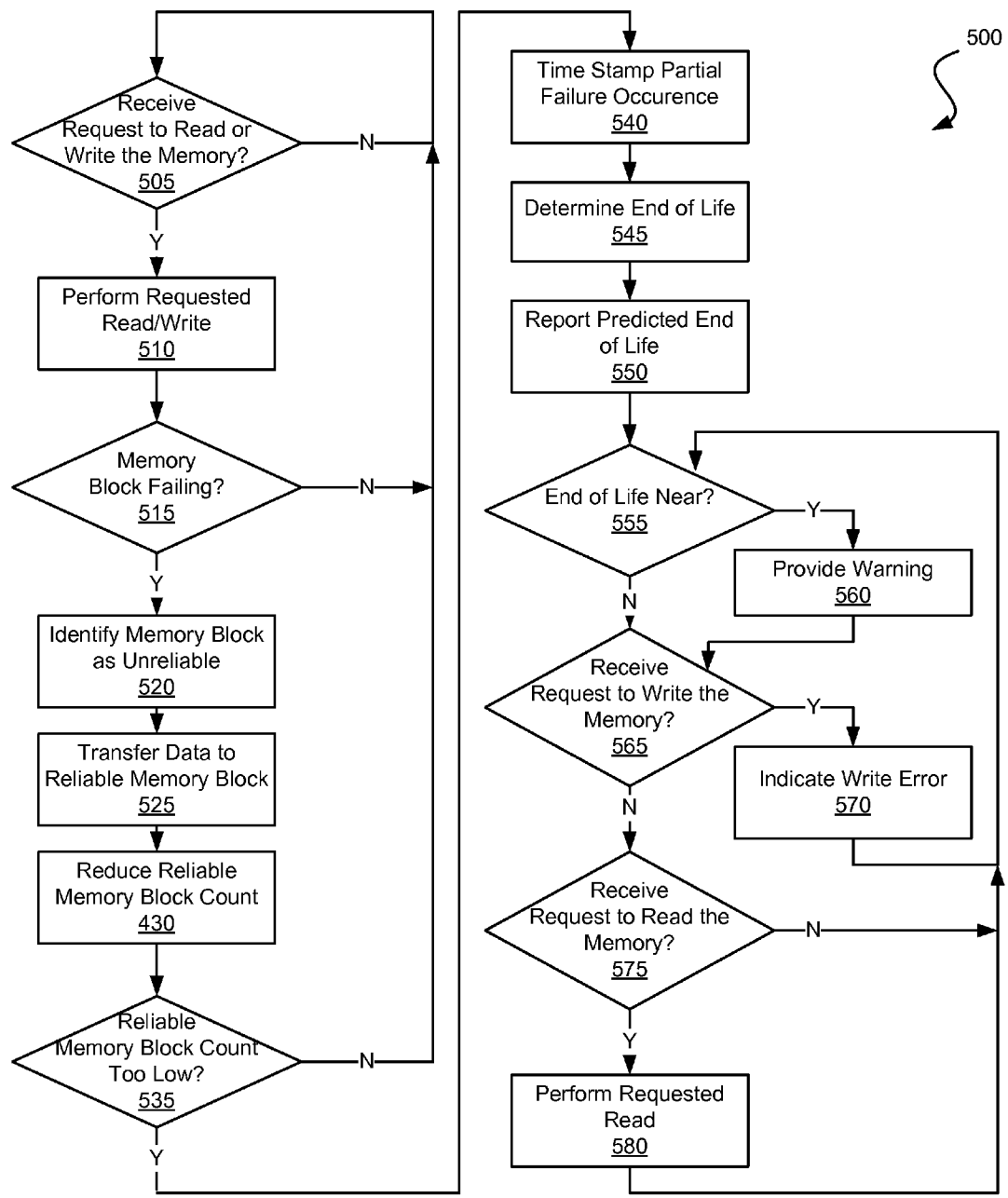
FIG. 5 is a flow diagram showing a method in accordance with one or more embodiments of the present invention for identifying a solid state drive as write prohibited and providing an estimate of remaining device life.

Turning to FIG. 5, a flow diagram 500 graphically depicts a method in accordance with various embodiments of the present invention for identifying a solid state drive as write prohibited (i.e., partially failed) and providing an estimate of remaining device life. Following flow diagram 500, is it determined whether the solid state drive has been presented with a request to read or write information to/from the solid state drive (block 505). Where a request for a read or a write is received (block 505), the requested read or write is performed (block 510). Thus, for example, where the request is a write request, information may be provided from the host to the controller which writes the data to a defined location in the flash memory. As another example, where the request is a read request, data from the requested location in the flash memory is transferred to the controller and then to the requesting host.

The reliability of the memory region (i.e., memory block) to which the data is written or from which it is read is determined (block 515). In some embodiments, this determination is only made after a write cycle. In other cases the determination is made after either a write cycle or a read cycle is done. Any approach known in the art for determining reliability of a memory block may be used. As an example, determination of block reliability may include determining the amount of time required to perform a program/erase cycle to the block. An increase in the length of time required to perform a program erase cycle may be used as a proxy for block reliability. Thus, a block may be identified as unreliable where the program/erase cycle time exceeds a threshold level. As another example, determination of block reliability may include monitoring the number of errors associated with accessing a given block. Where the error rate exceeds a threshold level, the block may be identified as unreliable. Based upon the disclosure provided herein, one of ordinary skill in the art will recognize a variety of circuits and/or approaches to identify when a block has become unreliable.

Where the block is determined to be reliable (block 515), a subsequent read or write request is awaited (block 505). Alternatively, where the block is determined to be unreliable (block 515), the memory block is identified as unreliable (block 520), and data from the unreliable memory block is moved to a reliable memory block (block 525). The number of reliable memory blocks is then decreased to reflect the recently identified unreliable block (block 530). This effectively reduces the value of 'n' as described above in relation to FIG. 2. It is then determined whether the number of remaining reliable memory blocks has become too low to continue guaranteeing reasonable operation (block 535). In some cases, this includes comparing the number of remaining reliable blocks (i.e., n) against a threshold value. This threshold value may be hard coded or user programmable depending upon the particular implementation. In particular embodiments of the present invention, the threshold value is set such that it is equal to the number of addressable blocks (i.e., m) in the flash memory. In other cases, the threshold value is set as some value greater than the number of blocks addressable in the flash memory.

Where the count of reliable blocks is sufficiently high (block 535), a subsequent read or write request is awaited (block 505). Alternatively, where the count of reliable blocks is too low (block 535), a partial failure of the solid state device is indicated and a time stamp corresponding to the occurrence of the partial failure is registered (block 540). In addition, an end of life for the solid state device is determined (block 545). This may be determined, for example, by adding a fixed time increment to the time stamp to yield an estimated time of failure (i.e., a point in the future when read data can no longer be guaranteed to a defined level of accuracy) for the solid state drive. In some cases, the fixed time increment may be a conservative estimate of how long data will be expected to be accessible from the partially failed solid state drive. The estimate may be modeled based upon an expected number of reads to a given block of memory and a statistically modeled life cycle of memory cells within the device from the point where the cells become unreliable. This determined end of life is reported (block 550). Reporting may include writing the end of life estimate to a register in the solid state drive and/or providing the end of life estimate to a host communicably coupled to the solid state drive.

It is determined whether the end of life is near (block 555). This may include, for example, determining whether the end of life is within one or more time periods. For example, it may be determined whether the end of life is within seventy-two hours. Based upon the disclosure provided herein, one of ordinary skill in the art will recognize a variety of time period thresholds that may be used in relation to the processes of block 555. Where the end of life is near (i.e., within a defined time period) (block 555), a warning message is provided (block 560). This may include, for example, providing a warning message to a host communicably coupled to the solid state drive.

At this juncture, the partially failed solid state drive has been modified to be a read only device, and writes to the solid state drive are prohibited. The write prohibited mode is set forth in blocks 565-580 below. It is determined whether the solid state drive has been presented with a request to read or write information to/from the solid state drive. In particular, it is determined whether a request to write information to the solid state drive has been received (block 565). Where a request to write has been received (block 565), an error message is provided to the requesting host indicating that the write was not accepted (block 570). Alternatively, it is determined whether a read request has been received (block 575). Where a read request has been received (block 575), the requested read is performed and the data is returned to the requesting host (block 580).

In some embodiments of the present invention, a partially failed solid state drive is reconstructed by transferring data from the partially failed solid state drive to a replacement drive. In some cases, reconstructing the drive may be done by using one or more processes discussed in U.S. patent application Ser. No. 12/286,591 entitled "A System and Method for Providing Performance-Enhanced Rebuild of a Solid-State Drive (SSD) in a Solid-State Drive Hard Disk Drive (SSD HDD) Redundant Array of Inexpensive Disks 1 (RAID1) Pair", and filed by Brian McKean on Sep. 30, 2008. The aforementioned application is incorporated herein by reference for all purposes.

As another example, a partially failed solid state drive is reconstructed by transferring data from the partially failed solid state drive to a replacement drive consistent with the systems and processes discussed below in relation to FIGS. 6-7 below. Turning to FIG. 6a, an array 600 of solid state drives 605, 606, 607 including at least one replacement solid state drive is shown in accordance with various embodiments of the present invention. In particular, array 600 includes two solid state drives 605, 606 that are actively storing data, and a replacement solid state drive 607 that is originally a replacement drive operating as a backup. As shown, solid state drives 605, 606, 607 are each communicably coupled to a system controller 650 that is capable of distributing data accesses across a number of solid state drives. In particular, system controller 650 is capable of directing logically addressed data writes to physical addresses on the active solid state drives 605, 606. Further, system controller 650 is capable of accessing data from physical addresses on the active solid state drives 605, 606 based upon a logical address included in a read request. System controller 650 includes a solid state drive rebuild circuit 655. Solid state drive rebuild circuit 655 governs transferring data from a partially failed solid state drive to a replacement solid state drive. In some embodiments of the present invention, solid state drive rebuild circuit 655 provides for scheduling the data transfer during off-peak operational time. Additional detail about transferring data from a partially failed solid state drive to a replacement solid state device is more fully described below.

As shown, solid state drive 605 includes a bank of flash memories 620 that are accessible via a solid state controller 610. Solid state controller 610 includes write prohibit circuitry and end of life indicator circuit similar to that described above in relation to FIG. 3. Solid state controller 610 is communicably coupled to system controller 650 via a read/write control bus 625. Read/write control bus 625 provides a number of signals that provide an interface for transferring data to/from solid state drive 605. In addition, solid state controller 610 provides a write prohibit signal 635 and an end of life signal 645. Write prohibit signal 635 is asserted whenever a partial failure of solid state drive 605 occurs and is de-asserted when solid state drive 605 is a read/write accessible drive, and end of life signal 645 provides an indication of a time in the future that data on solid state drive 605 is guaranteed to be available. End of life signal 645 is valid only after write prohibit signal 635 is asserted. End of life signal 645 and write prohibit signal 635 may be generated using processes similar to those discussed above in relation to FIGS. 4-5. Similarly, solid state drive 606 includes a bank of flash memories 621 that are accessible via a solid state controller 611. Solid state controller 611 includes write prohibit circuitry and end of life indicator circuit similar to that described above in relation to FIG. 3. Solid state controller 611 is communicably coupled to system controller 650 via a read/write control bus 626. Read/write control bus 626 provides a number of signals that provide an interface for transferring data to/from solid state drive 606. In addition, solid state controller 611 provides a write prohibit signal 636 and an end of life signal 646. Write prohibit signal 636 is asserted whenever a partial failure of solid state drive 606 occurs and is de-asserted when solid state drive 606 is a read/write accessible drive, and end of life signal 646 provides an indication of a time in the future that data on solid state drive 606 is guaranteed to be available. End of life signal 646 is valid only after write prohibit signal 636 is asserted. End of life signal 646 and write prohibit signal 636 may be generated using processes similar to those discussed above in relation to FIGS. 4-5. Similarly, solid state drive 607 includes a bank of flash memories 622 that are accessible via a solid state controller 612. Solid state controller 612 includes write prohibit circuitry and end of life indicator circuit similar to that described above in relation to FIG. 3. Solid state controller 612 is communicably coupled to system controller 650 via a read/write control bus 627. Read/write control bus 627 provides a number of signals that provide an interface for transferring data to/from solid state drive 607. In addition, solid state controller 612 provides a write prohibit signal 637 and an end of life signal 647. Write prohibit signal 637 is asserted whenever a partial failure of solid state drive 607 occurs and is de-asserted when solid state drive 607 is a read/write accessible drive, and end of life signal 647 provides an indication of a time in the future that data on solid state drive 607 is guaranteed to be available. End of life signal 647 is valid only after write prohibit signal 637 is asserted. End of life signal 647 and write prohibit signal 637 may be generated using processes similar to those discussed above in relation to FIGS. 4-5.

In operation, data is transferred to and from solid state drives 605, 606 that are actively storing data. This process continues as the memory cells in solid state drives 605, 607. Eventually, the memory cells in solid state drives 605, 607 become unreliable. Using one or more of the mechanisms discussed above in relation to FIGS. 3-5, one of solid state drives 605, 606 may be identified as a partially failed solid state drive. For purposes of this discussion, it is assumed that solid state drive 605 is identified as partially failed, and solid state drive 607 is a replacement drive. Thus, write prohibit 635 is asserted indicating to system controller 650 that solid state drive has partially failed. At this juncture, solid state rebuild control circuit 655 may remap all data maintained on partially failed solid state drive 605 to replacement solid state drive 607, and to cause a block transfer of all data from partially failed solid state drive 605 to replacement solid state drive 607. Such an approach requires that system controller 650 immediately spend considerable processing resources moving data from partially failed solid state drive 605 to replacement solid state drive 607. This may not be practical as there may be substantial ongoing access to the various solid state drives supported by controller 650.

To alleviate the possibility of overwhelming system controller 650 with data transfer from partially failed solid state drive 605 to replacement solid state drive 607 at an inconvenient time, transfer of data from partially failed solid state drive 605 to replacement solid state drive 607 may be performed over an extended period of time, rather than immediately as in the previous example. In such a case, any request for read data to logical addresses corresponding to physical addresses on partially failed solid state drive 605 are serviced by performing a read to solid state drive 605 under control of system controller 650. In contrast, any write request to a logical address that maps to a physical address on partially failed solid state drive 605 is remapped for writing to replacement solid state drive 607. This remapping and data transfer continues on a write by write basis until either all of the data that was originally maintained on partially failed solid state drive is written to replacement solid state drive, or until a convenient scheduled time for performing a block transfer of all remaining data on partially failed solid state drive. Thus, for example, system controller 650 may schedule transfer of data from partially failed solid state drive 605 to replacement solid state drive 607 during an expected off-peak time. In some cases, system controller 650 assures that the off-peak time is scheduled at some point before the expected full failure indicated by end of life signal 645. Once the scheduled transfer is complete, partially failed solid state drive 605 can be removed and replaced. The solid state drive added in place of partially failed solids state drive 605 becomes a replacement drive as solid state drive 607 is designated for actively storing data.

Using this approach, data can be transferred from partially failed solid state drive 605 to replacement solid state drive 607, while allowing access in and out of solid state drive 606 and/or partially failed solid state drive 605 without exceptionally long access times. Further, this approach allows for performing transfers on a write to write basis which does not impact access bandwidth and/or latency offered by system controller 650. Where the end of life is far enough in the future, there is a possibility that a substantial amount of data may be transferred off the partially failed solid state drive before the end of life deadline. Latency and bandwidth is only impacted during a final data transfer scheduled for an off peak period before the estimated failure time indicated by end of life signal 645. During this off peak time, the impact on latency and bandwidth is not as significant as the impact would be during a peak time.

In some embodiments of the present invention, each of solid state drives 605, 606, 607 may be equipped with one or more LEDs (not shown) or other indicator element(s) that provide an indication of the operational status of the corresponding drive. For example, the LED may flash at a certain rate when the corresponding drive is fully operational, at a slower rate when the corresponding drive is partially failed, and glows solid when the contents of the drive have been successfully migrated to another location (see FIG. 7) and the drive is ready to be removed from the system. Based upon the disclosure provided herein, one of ordinary skill in the art will recognize a variety of external indications that may be provided to signal one or more of the aforementioned operational states in accordance with different embodiments of the present invention.

The life cycle of the device may be further extended where partial failure is indicated at a memory block level. In such a case, an individual memory block may be identified as partially failed. Data in the partially failed block may be moved to another reliable memory block, and write-once, read-many data from a reliable memory block may be moved to the partially failed memory block. In some cases, meta-data may be used to identify the write-once, read many data. The aforementioned approach allows for extending the life cycle of a solid state drive.

Figure 6B:
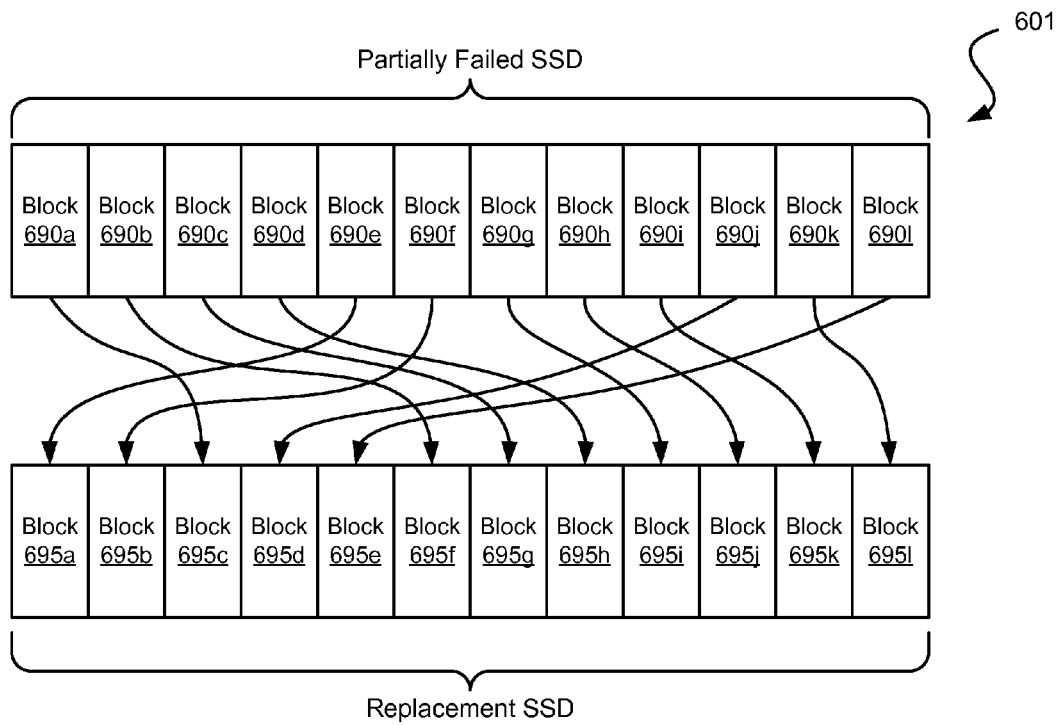
FIG. 6b graphically represents a process in accordance with some embodiments of the present invention for building a replacement solid state drive from an partially failed solid state drive.
Figure 6A:
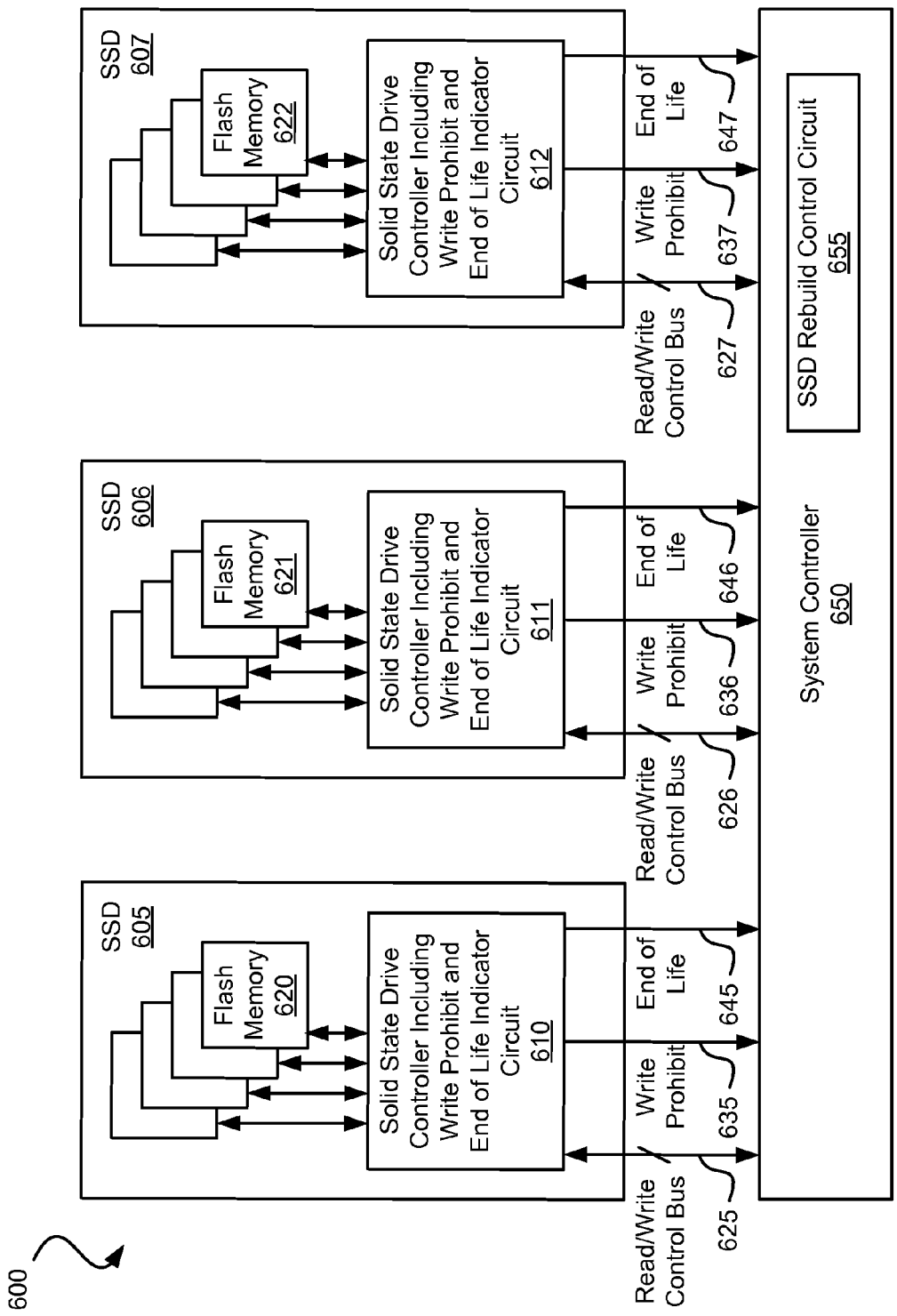
FIG. 6a depicts an array of solid state drives including at least one replacement solid state drive in accordance with various embodiments of the present invention.

Turning to FIG. 6b, the aforementioned process of a combination of write by write transfers and a scheduled block transfer is depicted in a graphic 601. Partially failed solid state drive 605 is represented as a number of blocks 690, and replacement solid state drive is represented by a number of blocks 695. As shown by the arrow lines from blocks 690 to blocks 695, a write is directed to block 690e after write prohibit signal 635 is asserted. The write is remapped to block 695a and performed to block 695a, and block 690e is marked as unused. Next, a write is directed to block 690f. The write is remapped to block 695b and performed to block 695b, and block 690f is marked as unused. Next, a write is directed to block 690a. The write is remapped to block 695c and performed to block 695c, and block 690a is marked as unused. Next, a write is directed to block 690j. The write is remapped to block 695d and performed to block 695d, and block 690j is marked as unused. Next, a write is directed to block 690l. The write is remapped to block 695e and performed to block 695e, and block 690l is marked as unused.

At this juncture, the off peak time of the scheduled transfer from partially failed solid state drive 605 to replacement solid state drive 607 is performed. The process includes copying data from blocks not already transferred to replacement solid state drive 607. In particular, the data from block 690b is transferred to block 695f, and block 690b is marked as unused; the data from block 690c is transferred to block 695g, and block 690c is marked as unused; the data from block 690d is transferred to block 695h, and block 690d is marked as unused; the data from block 690g is transferred to block 695i, and block 690g is marked as unused; the data from block 690h is transferred to block 695j, and block 690h is marked as unused; the data from block 690i is transferred to block 695k, and block 690i is marked as unused; and the data from block 690k is transferred to block 695l, and block 690k is marked as unused. Once the scheduled transfer is complete, partially failed solid state drive 605 can be removed and replaced. The solid state drive added in place of partially failed solids state drive 605 becomes a replacement drive as solid state drive 607 is designated for actively storing data.

Figure 7:
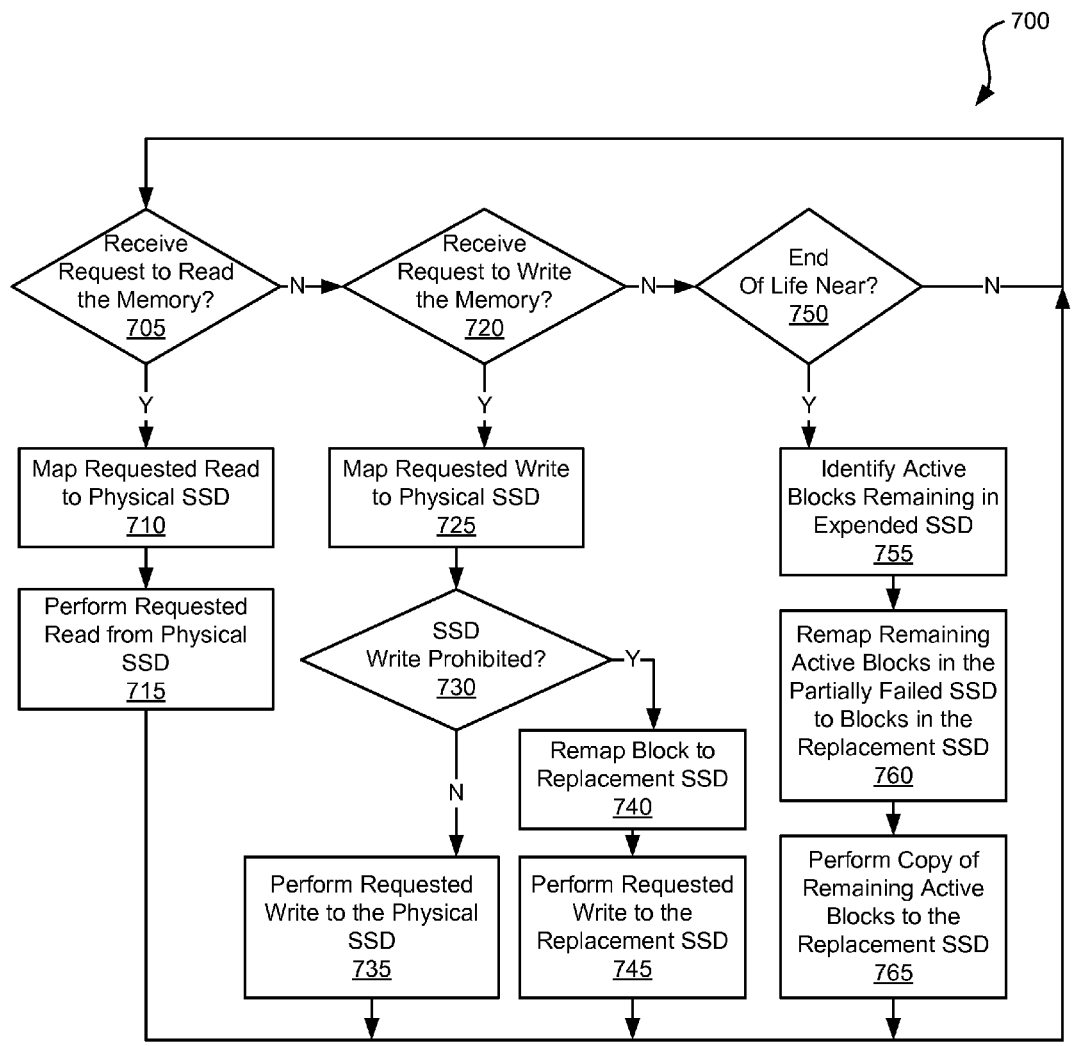
FIG. 7 is a flow diagram showing a method in accordance with some embodiments of the present invention for building a replacement solid state drive from an partially failed solid state drive.

Turning to FIG. 7, a flow diagram 700 shows a method in accordance with some embodiments of the present invention for building a replacement solid state drive from an partially failed solid state drive. Following flow diagram 700, it is determined whether a request to read data from a logical address (block 705). Where such a read request is received (block 705), the logical address is mapped to a physical address by a system controller (block 710), and the data from the mapped physical address is retrieved by the system controller and returned to the requesting device (block 715). This process is performed even where the solid state drive that holds the mapped physical address has partially failed. This is possible as the data may be reliably read for at least a finite period after the solid state drive is identified as partially failed.

Alternatively, it is determined whether a request to write data to a logical address (block 720). Where such a write request is received (block 720), the logical address is mapped to a physical address by a system controller (block 725). It is then determined whether the solid state drive in which the physical exists has partially failed (i.e., is write protected) (block 730). This may be indicated by assertion of a write prohibit signal provided from the respective solid state drives in the system. Where the solid state drive has not partially failed, but rather is fully functional (block 730), the received write data is written to the determined physical address in the solid state drive (block 735). Alternatively, where the solid state drive has partially failed (block 730), the physical block to which the write data is directed is remapped to a physical block in a replacement solid state drive (block 740), and the requested write is carried out to the replacement solid state drive (block 745). It should be noted that in some cases the information stored in the partially failed solid state drive may become irrelevant over time. In such cases, the process of transferring the data to another solid state drive is not required. The aforementioned remapping process (block 740) includes identifying the block in the partially failed solid state drive as unusable and/or mapping the logical address to the physical address in the replacement solid state drive. As such, all future accesses to the logical address will be directed to the replacement solid state drive.

Where neither a read request (block 705) nor a write request (block 720) are received, it is determined whether any solid state drives in the system are near their end of life (block 750). This may be done, for example, by comparing any estimates of future failure times for partially failed devices with a current date and time. Where it is determined that a solid state drive is near its end of life, any remaining active blocks (i.e., blocks that have not been previously remapped to a replacement drive) are identified (block 755). This may include, for example, querying a mapping table maintained in the system controller to determine what part of the memory space of the partially failed solid state drive remain. These identified blocks in the partially failed solid state drive are remapped to blocks in the replacement solid state drive (block 760), and the data from the remapped blocks of the partially failed solid state drive is copied to the corresponding block in the replacement solid state drive (block 765). Once this transfer of data from the partially failed solid state drive to the replacement solid state drive is complete, the partially failed solid state drive may be removed and discarded.

It should be noted that while array 600 and flow diagram 700 operate to govern the end of life on a solid state drive basis, that other embodiments of the present invention may govern the end of life on a flash device basis. Thus, where a solid state drive includes a number of flash devices, one flash device in the solid state drive may be identified as partially failed and marked as read only (i.e., write prohibited). At this juncture, data from the partially failed flash device may be transferred to an extra flash device maintained in the solid state drive extending the life of the solid state drive. Thus, it effectively operates as a wear leveling algorithm operating on a flash device level. In the aforementioned approach, functions described as being performed by system controller 650 are moved to a controller in the individual solid state drive.

Alternatively, the solid state drive may include flash devices installed in DIMM sockets, USB interfaces, and/or other replaceable interfaces. In such cases, a partially failed device may be migrated to another installed flash device. Subsequently, the partially failed flash device may be removed. In such cases, the controller in the solid state drive includes various of the functions described as being performed by system controller 650. Such an approach allows for creating a solid state drive with a number of replaceable flash modules. By allowing for replacement of the flash modules within the solid state drive, the life cycle of the solid state drive cane be greatly enhanced.

As another example of management at a device level, an individual flash device that is nearing its useful life may be identified as partially failed and marked as read only. In combination with this, a controller circuit in the solid state drive may move data in the partially failed flash device to another reliable device, and to move shift write-once, read-many data to the partially failed flash device. In some cases, meta-data may be used to identify the write-once, read many data. The aforementioned approach allows for extending the life cycle of a solid state drive.

The three preceding examples apply the management approaches discussed in relation to FIGS. 6-7 to a sub-drive level. In particular, the management approaches are applied to flash devices. It should be further noted that the management approaches may be extended to management at a memory block level or even at a memory cell level.

In conclusion, the invention provides novel systems, devices, methods and arrangements for governing the life cycle of a solid state drive and/or flash memory device. While detailed descriptions of one or more embodiments of the invention have been given above, various alternatives, modifications, and equivalents will be apparent to those skilled in the art without varying from the spirit of the invention. For example, while the various embodiments of the present invention focus upon transition of a solid state drive from a fully functional state to a partially failed state and transfer of the data on a partially failed solid state drive to a replacement solid state drive, it should be noted that a similar process and circuitry may be used to transition blocks of memory (or even individual memory cells) within a solid state drive from a fully functional state to a partially failed state and transfer of the data maintained in the block to a replacement block. As such, the processes discussed herein may be used as an alternative to traditional wear leveling schemes. Based upon the disclosure provided herein, one of ordinary skill in the art will recognize a variety of other applications for the various inventions described herein. Therefore, the above description should not be taken as limiting the scope of the invention, which is defined by the appended claims.

It should be noted that while various embodiments of the present invention have been described as using flash memory, that other types of non-volatile memories may be used in relation to different embodiments of the present invention. Such non-volatile memories may include, but are not used to, Phase Change Memory, Spin-Torque Memory, Ferroelectric Memory, Magnetic Memory, Resistive Memory, Racetrack Memory, Oxide Trap based Flash Memory, or other memory types known in the art. Also, it should be noted that while various embodiments of the present invention have been described as performing block transfers or of indicating a block of memory as partially failed, the invention may be applied to any memory portion. A memory portion may be, but is not limited to, a bit, a byte, a word, a block, a page or any other memory portion that may be accessed in a memory device or memory system.

In conclusion, the invention provides novel systems, devices, methods and arrangements for managing end of life of a solid state drive and/or flash memory device. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A storage system, the storage system comprising:
   a first non-volatile memory portion and a second non-volatile memory portion, wherein the first non-volatile memory portion and the second non-volatile memory portion are addressable in the storage system;
   a failure indication circuit operable to identify the first non-volatile memory portion as read only upon determination that a subset of the first non-volatile memory portion is unreliable and the subset of the first non-volatile memory portion is larger than a threshold level;
   a time stamp circuit operable to identify a first point in time when the failure indication circuit identified the first non-volatile memory portion as read only; and
   an end of life circuit operable to estimate a second point in time based at least in part on the first point in time, wherein the second point in time corresponds to a time when the reliability of the storage system is unreliable.

2. The storage system of claim 1, wherein the storage system further comprises:
   a control circuit operable to receive a write request directed to the first non-volatile memory portion, and direct the write request to the second non-volatile memory portion based at least in part on identification of the first non-volatile memory portion as read only.

3. The storage system of claim 2, wherein the first non-volatile memory portion is included in a first solid state drive, wherein the second non-volatile memory portion is included in a second solid state drive, wherein the storage system further comprises:
   a system controller communicably coupled to the first solid state drive and the second solid state drive, wherein the end of life circuit is included in the system controller.

4. The storage system of claim 3, wherein the system controller is operable to assure that all data from the first solid state drive is transferred to the second solid state drive before the second time.

5. The storage system of claim 2, wherein the control circuit is implemented as part of an integrated circuit.

6. The storage system of claim 1, wherein the first non-volatile memory portion is included in a first solid state storage device, and wherein the second non-volatile memory portion is included in a second solid state storage device.

7. The storage system of claim 6, wherein the storage system further comprises:
a system controller communicably coupled to the first solid state drive and the second solid state drive, wherein the end of life circuit is included in the system controller.

8. The storage system of claim 7, wherein the system controller is operable to assure that all data from the first solid state drive is transferred to the second solid state drive before the estimated end of life.

9. The storage system of claim 1, wherein the system further comprises:
a mapping circuit operable to map the second non-volatile memory portion to the first non-volatile memory portion based at least in part upon determining that the subset of the first non-volatile memory portion is unreliable.

10. The storage system of claim 9, wherein the mapping circuit is further operable to:
receive a write request directed to the first non-volatile memory portion; and
direct the write request to the second non-volatile memory portion.

11. The storage system of claim 1, wherein the first non-volatile memory portion and the second non-volatile memory portion are implemented as flash memory cells.

12. The storage system of claim 1, wherein the storage system further comprises:
a control circuit operable to receive a write request directed to the subset of the first non-volatile memory portion, and to direct the write request to a subset of the second non-volatile memory portion based at least in part on identification of the first non-volatile memory portion as read only.

13. The storage system of claim 12, wherein the control circuit is further operable to:
receive a read request directed to the first subset of the first non-volatile memory portion; and
direct the read request to the first subset of the first non-volatile memory portion where the read request is received prior to directing the write request to the subset of the second non-volatile memory portion.

14. A storage device, the device comprising:
a first number of memory portions each including a plurality of memory cells, wherein a second number of the first number of memory portions are addressable, and wherein a difference between the first number and the second number is an over provisioned number of memory portions;
a control circuit that includes:
an unreliable block identification circuit, wherein the unreliable block identification circuit is operable to determine that one or more of the first number of memory portions is unreliable, and wherein upon determining that one or more of the first number of memory portions is unreliable the over provisioned number of memory portions is reduced; and
a partial failure indication circuit operable to disallow write access to any of the memory portions upon determination that the over provisioned number of memory portions is less than or equal to a threshold level;
a time stamp circuit operable to identify a first point in time when the partial failure indication circuit disallowed write access to the memory portions; and
an end of life circuit operable to estimate a second point in time when the ability to read one or more of the plurality of memory portions can no longer be guaranteed wherein the second point is time is calculated by adding a time increment to the first point in time.

15. The device of claim 14, wherein the first number of memory portions are non-volatile memory portions.

16. The device of claim 15, wherein the non-volatile memory portions are implemented as flash memory cells.

17. The device of claim 14, wherein the device comprises:
a control circuit operable to receive a write request directed to a first subset of the first number of memory portions, and to direct the write request to a second subset of the first number of memory portions based at least in part on identification of the first subset of the first number of memory portions as read only.

18. The device of claim 17, wherein the control circuit is further operable to:
receive a read request directed to the first subset of the first number of memory portions; and
direct the read request to the first subset of the first number of memory portions where the read request is received prior to directing the write request to the second subset of the of the first number of memory portions.

19. The device of claim 14, wherein the first subset of the first number of memory portions are included in a first solid state drive, and wherein the second subset of the first number of memory portions are included in a second solid state drive.

20. The device of claim 19, wherein the device further comprises:
a system controller communicably coupled to the first solid state drive and the second solid state drive, wherein the end of life circuit is included in the system controller.

21. The device of claim 20, wherein the system controller is operable to assure that all data from the first solid state drive is transferred to the second solid state drive before the estimated end of life.

22. The device of claim 14, wherein the time increment is an estimate of how long data will remain readable after the first point in time.

23. The device of claim 14, wherein the estimate of how long data will remain readable is a predetermined, fixed value.

* * * * *